(12) United States Patent
Mavretic et al.

(10) Patent No.: US 6,424,232 B1
(45) Date of Patent: Jul. 23, 2002

(54) METHOD AND APPARATUS FOR MATCHING A VARIABLE LOAD IMPEDANCE WITH AN RF POWER GENERATOR IMPEDANCE

(75) Inventors: Anton Mavretic, Natick, MA (US); Tomislav Lozic, Voorhees, NJ (US)

(73) Assignee: Advanced Energy's Voorhees Operations, Voorhees, NJ (US)

( * ) Notice: Subject to any disclaimer, the term of this patent is extended or adjusted under 35 U.S.C. 154(b) by 0 days.

(21) Appl. No.: 09/451,512

(22) Filed: Nov. 30, 1999

(51) Int. Cl.[7] .............................................. H03H 7/40
(52) U.S. Cl. ...................................... 333/17.3; 333/32
(58) Field of Search .................................. 333/17.3, 32

(56) References Cited

U.S. PATENT DOCUMENTS

| | | | |
|---|---|---|---|
| 2,981,902 A | | 4/1961 | Familier .................... 333/17.1 |
| 5,195,045 A | * | 3/1993 | Keane et al. ........... 333/17.3 X |
| 5,424,691 A | | 6/1995 | Sadinsky ................... 333/17.3 |
| 5,654,679 A | | 8/1997 | Mavretic et al. ........... 333/17.3 |
| 5,689,215 A | * | 11/1997 | Richardson et al. ....... 333/17.3 |
| 5,815,047 A | * | 9/1998 | Sorenson et al. .......... 333/17.3 |
| 5,842,154 A | * | 11/1998 | Harnett .................. 333/17.3 X |

* cited by examiner

*Primary Examiner*—Benny Lee
*Assistant Examiner*—Stephen E. Jones
(74) *Attorney, Agent, or Firm*—Blakely, Sokoloff, Taylor & Zafman LLP

(57) ABSTRACT

Matching the variable impedance of a load with the fixed impedance of a radio frequency (RF) power generator to provide maximum power transfer. The impedance matching network further allows a RF power generator to vary the frequency of the voltage applied to a load, e.g., a plasma chamber as may be utilized in semiconductor or flat panel plasma display manufacturing processes. The impedance matching network further utilizes fixed solid state components to adjust the impedance of the attached load to provide maximum power transfer between the generator and the load. A parallel switched capacitor network is controlled by an electrical switching means such as PIN diodes to turn fixed capacitors on or off. A means for varying the frequency of the applied voltage is used to match the impedance of the load with the impedance of the RF power generator within milliseconds.

15 Claims, 7 Drawing Sheets

METHOD AND APPARATUS FOR MATCHING A VARIABLE LOAD IMPEDANCE WITH AN RF POWER GENERATOR IMPEDANCE

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The present invention relates to the field of impedance matching networks. More specifically, the present invention relates to a method and apparatus for matching the impedance of a load with the internal impedance of a radio frequency (RF) power generator to provide maximum power transfer, where the frequency of the applied voltage generated by the RF power generator and the impedance of the load may independently vary.

2. Description of the Related Art

The Federal Communications Commission (FCC) has designated Industrial, Scientific and Medical (ISM) frequencies at 13.56 MHz, 27.12 MHz and 40.68 MHz, respectively, and other higher frequencies. ISM frequencies may be radiated by equipment into the atmosphere without concern for causing radio frequency disturbances to other equipment. A power density as governed by FCC and CE mark must still be met. Plasma etch and deposition equipment manufacturers have traditionally used the 13.56 MHz frequency to operate a plasma chamber for manufacturing integrated circuits and plasma displays. However, ISM frequencies do not always provide an optimum frequency at which to operate a plasma chamber to achieve critical process steps, especially in view of decreasing integrated circuit dimensions. As a result, equipment manufacturers have developed plasma chambers that are capable of operating over a range of frequencies.

ISM-based RF power generators, however, are commonly designed to assure minimum deviation from a set ISM frequency, e.g., 13.56 MHz. In contrast, a variable frequency RF power generator ("generator") may be coupled to a load, e.g., a plasma chamber, to manipulate the frequency of the voltage applied to the load so that the load may be operated over a range of voltages and frequencies. However, in an alternating current (AC) circuit, impedance is affected by the frequency of the applied voltage, which impedance, in turn, affects the transfer of power between the generator and the load. Moreover, the impedance of a plasma chamber may vary independent of the frequency of the applied voltage depending on such variables as chamber pressure, gas composition, and plasma ignition. What is needed, therefore, is an impedance matching network that allows the frequency of the applied voltage to vary while maintaining the impedance of the load with respect to the generator, i.e., the impedance that the generator will see.

As is well known to those of ordinary skill in the related art, impedance for a given circuit may be comprised of both a resistive component and a reactive component, the latter of which may be either inductive or capacitive. Maximum power transfer between a generator and an attached load is achieved when the resistance of the load is equal to the internal resistance of the generator and the net reactance between the load and generator is zero. Thus, it is advantageous to counterbalance the reactance between the generator and the load to achieve a net reactance of zero. A net reactance of zero between the generator and load occurs when the impedance of the load is the complex conjugate of the internal impedance of the generator. Thus, if the generator has an inductive reactance, then a load that has a capacitive reactance of equal magnitude and opposite phase will result in a net reactance of zero to the circuit comprising the generator and the load, and vise versa. An impedance matching network may be utilized to maintain an input impedance that is the complex conjugate of the internal impedance of the generator as the frequency of the voltage applied by the generator to the load varies, and/or as the impedance of the load varies, so that maximum power transfer occurs between the generator and the load.

With reference to FIG. 1, a prior art impedance matching network 100 is illustrated. A RF power generator can be coupled to RF input 120. A load such as a plasma chamber can be coupled to RF output 130. The impedance matching network 100 ("network") comprises a phase detector 101 that samples the transmission line 108 at a fixed impedance, e.g., 50 ohms, and generates a signal over line 112 to control board 110. Control board 110 then causes servo motor 107 to turn variable capacitor 106, depending on the polarity of the phase shift between the input RF voltage and current caused by a non-linear impedance in the load, e.g., as occurs under ignited plasma conditions in a plasma chamber.

Magnitude detector 109 also samples the deviation from an impedance of, e.g., 50 ohms, on transmission line 108, and generates a signal over line 111 to control board 110 based thereon. Control board 110 then causes servo motor 103 to turn variable capacitor 102. The capacitance provided by capacitor 102 is also dependent, to a lesser extent, on the polarity of the phase shift between the RF voltage and current. The magnitude detector 109 detects the deviation from a characteristic impedance of, for example, 50 ohms. If the impedance in line 108 is greater than 50 ohms, the signal transmitted over line 111 is positive, and if the impedance in line 108 is less than 50 ohms, the signal transmitted over line 111 is negative. As can be seen, the prior art impedance matching network 100 is relatively slow because of the time needed for servo motors 103 and 107 to turn capacitors 102 and 106, respectively, to match the impedance of the generator with the impedance of the load. Moreover, the network 100 does not change the frequency of the applied voltage as may be desired depending on the load. It should be noted that FIG. 1 illustrates the so called L-match version of the prior art impedance matching network 100. However, the network applies equally to the Π-version of the matching network architecture.

Today, semiconductor and flat panel plasma display equipment manufacturing process times are decreasing, such that the amount of time required to establish matching impedance between an RF power generator and a plasma chamber (whose impedance varies) is a limiting factor affecting throughput on the manufacturing line. What is needed is an impedance matching network coupling a generator to a load, e.g., a plasma chamber, that allows the generator to vary the frequency of the voltage applied to the load and utilizes fixed solid state components to rapidly and accurately adjust the input impedance of the attached load to maintain maximum power transfer to the load.

BRIEF SUMMARY OF THE INVENTION

The present invention is related to the field of impedance matching networks. More specifically, the present invention relates to a method and apparatus for matching the variable impedance of a load with the fixed internal impedance of a radio frequency (RF) power generator ("generator") to provide maximum power transfer to the load, where the frequency of the applied voltage generated by the RF power generator and the impedance of the load may independently vary. The impedance matching network allows a generator to vary the frequency of the voltage applied to a load, for example, a plasma chamber, as may be utilized in semiconductor or flat panel plasma display manufacturing processes, antenna tuning in transmitters, etc. The impedance matching network further utilizes fixed solid state components to adjust, within milliseconds, the input impedance of the attached load to accomplish maximum power transfer to the load. A means for varying the frequency of the applied voltage and a parallel switched capacitor network for very quickly matching the input impedance of the load with the impedance of the generator is used.

BRIEF DESCRIPTION OF THE SEVERAL VIEWS OF THE DRAWINGS

The present invention is illustrated by way of example and not limitation in the following figures. Like references indicate similar elements, in which.

DETAILED DESCRIPTION OF THE INVENTION

Described herein is a method and apparatus for matching the variable impedance of a load with the fixed impedance of a radio frequency (RF) power generator ("generator") to provide maximum power transfer from the generator to the load, where the generator varies the frequency of the voltage applied to the load. In the following description, numerous specific details and examples are set forth in order to provide a thorough understanding of the present invention. It will be apparent, however, to one of ordinary skill in the art that the present invention may be practiced in this or related fields without this specific information. In other instances, well-known circuits, components, and techniques have not been shown in order not to unnecessarily obscure the present invention.

Figure 2:
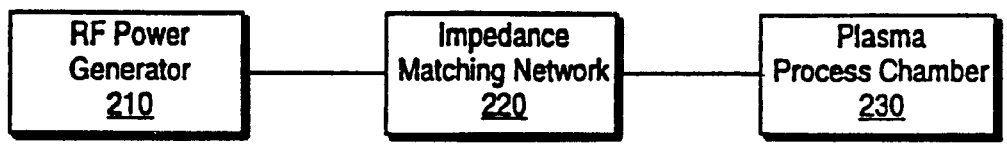
FIG. 2 is a block diagram of an embodiment of the present invention.

The increasing complexity of present and future generation plasma processing requirements significantly impacts the performance requirements of radio frequency (RF) power generators and related impedance matching networks used in this field. Plasma processing equipment manufacturers continue to reduce process times, modify plasma chamber pressures and gas compositions, and decrease plasma chamber cleaning cycle times in order to increase throughput, provide consistent production and reliable performance. To that end, prior art motor driven impedance matching networks are being replaced by faster, electronically controlled impedance matching networks. As the block diagram in FIG. 2 illustrates, an embodiment of the present invention provides a solid state impedance matching network 220 ("network 220") that employs no moving electrical or mechanical parts to maintain an input impedance of, for example, 50 ohms, and allows an RF power generator 210 ("generator 210") to vary the frequency of the applied voltage around a base frequency to achieve, among other things, plasma ignition in the plasma process chamber 230 ("plasma chamber").

Figure 3:
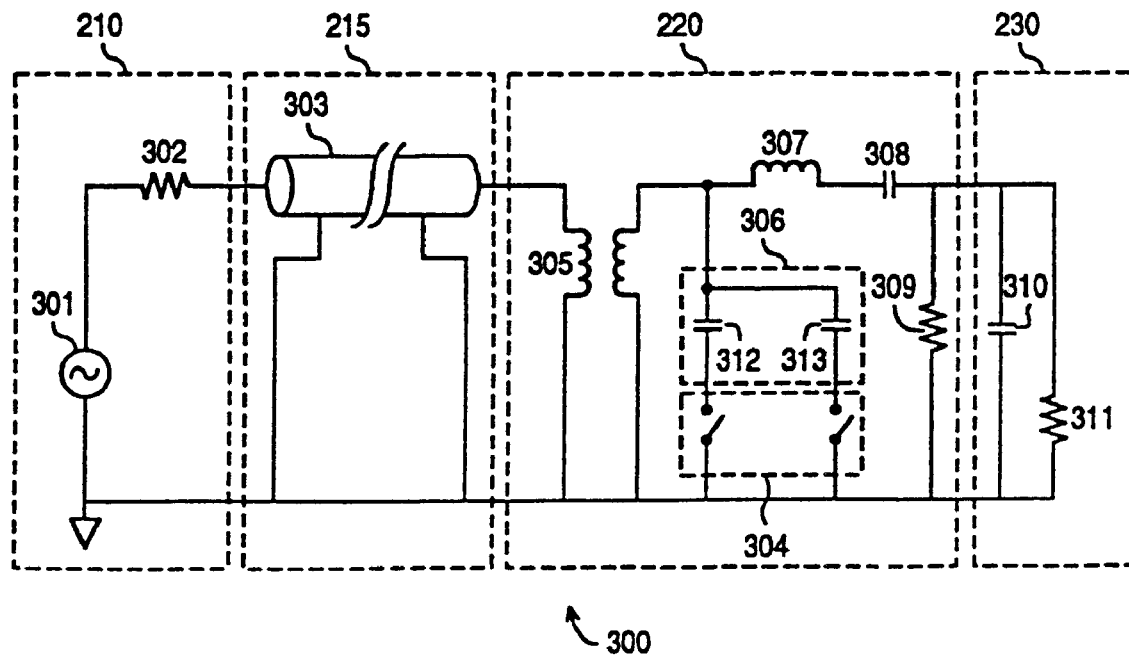
FIG. 3 is a schematic diagram providing an electrical representation of an embodiment of the present invention.

FIG. 3 is an electrical schematic representing the RF power generator 210, impedance matching network 220, connector 215 connecting generator 210 to network 220, and plasma processing chamber 230 coupled to network 220. The generator 210 is comprised of an alternating current power supply 301 and internal impedance 302. The power provided by the generator 210 is variable from 0 watts to 5 kilowatts or more. The generator base frequency is arbitrary. However, it is common practice in the semiconductor industry to use the ISM frequency of 13.56 MHz. The generator's internal impedance 302 generally is 50 ohms, but the impedance could be any value, as long as the cable 303 delivering power to the network 220 has the same characteristic impedance.

Within the impedance matching network 220, RF transformer 305 may or may not be utilized. The purpose of transformer 305 is to further transform the input impedance from 50 ohms to some lower value, e.g., 12.5 ohms, so that the portion of the impedance matching network to the right of the transformer 305 will operate at a lower impedance level.

A capacitance 306 is comprised of at least one fixed-value capacitor 312. In one embodiment, an additional number of capacitors may be coupled in parallel to capacitor 312, as is illustrated by capacitor 313. Sufficient capacitors may be coupled in parallel to capacitor 312 to provide, for example, 8, 16, or more discrete values. The capacitors are electrically and individually switched by respective switches in switch circuit 304. In one embodiment, diodes with a large intrinsic region between p- and n-doped semiconducting regions, hereafter referred to as PIN diodes, may be utilized to provide the switching function. In a second embodiment, switch circuit 304 is comprised of RF relays. Optional inductance 307 is a fixed value as well. The value of resistance 309 is selected to maintain the capacitance 306 discharged under no plasma ignition conditions. The portion of network 220 comprised of capacitance 306, induction 307, and capacitance 308 is a typical L-type impedance matching network configuration. With respect to the plasma chamber 230, capacitive component 310 and resistive component 311 are the equivalent capacitance and resistance representing a plasma chamber when ignited. The same principle as discussed above could be used for different matching network configurations such as Π-sections etc.

Figure 4:
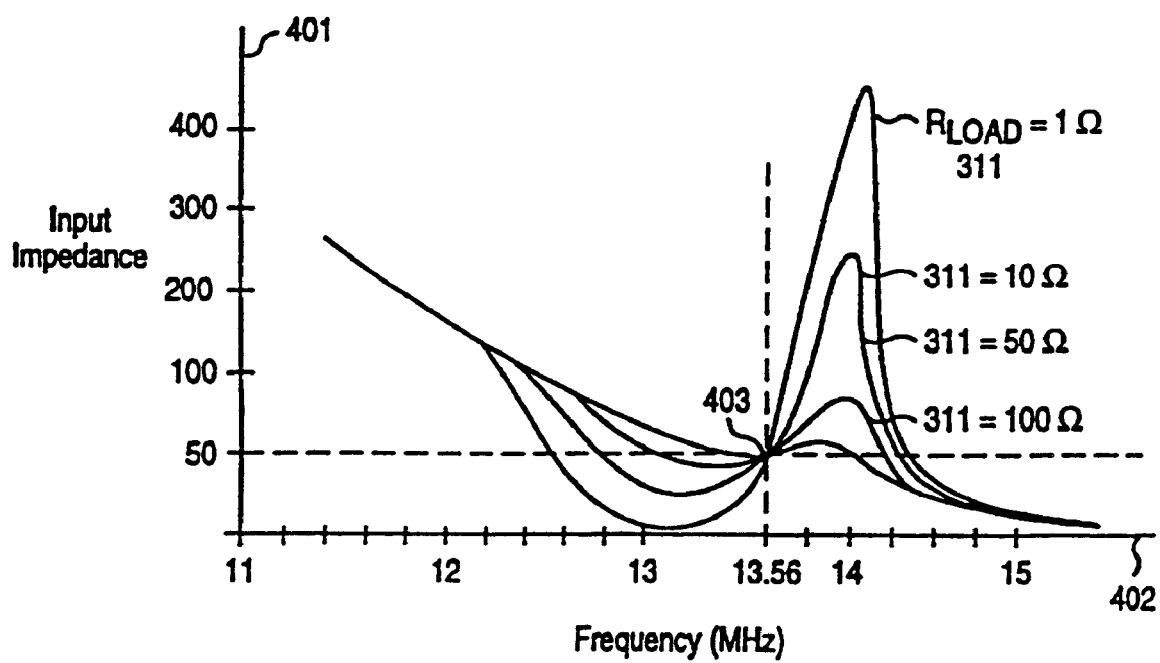
FIG. 4 provides a graphical analysis of the simulation of the real part of input impedance versus frequency for several load impedances for the circuit in FIG. 3.

FIG. 4 provides a graphical analysis of a simulation of real part of input impedance versus frequency for varying load impedance for the circuit in FIG. 3, in which a constant input impedance, i.e., the impedance seen by the generator 210 from the load, is maintained by network 220 over a load impedance range, for example, of 1 to 100 ohms. (Typical resistive loads for ignited plasma conditions in a plasma chamber are from 1 to 100 ohms). The vertical axis 401 represents the real part of the input impedance while the horizontal axis represents the frequency of the applied voltage. In the simulation, both the frequency of the applied voltage and the resistive load component 311 are varied. The capacitive load component 310 is maintained as a constant.

Regardless of the value of the resistive load, all the curves in FIG. 4 go through point 403 where input impedance is 50 ohms and the frequency of the applied voltage is 13.56 MHz. In the case where the load is a plasma chamber, it is advantageous to select values of capacitance 306, inductance 307, and capacitance 308 in the impedance matching network 220 such that those impedance and frequency conditions are satisfied. However, it is well understood by those of ordinary skill in the related art that other values of inductance and capacitance may be chosen, depending on the type of load coupled to the impedance matching network 220.

Figure 5:
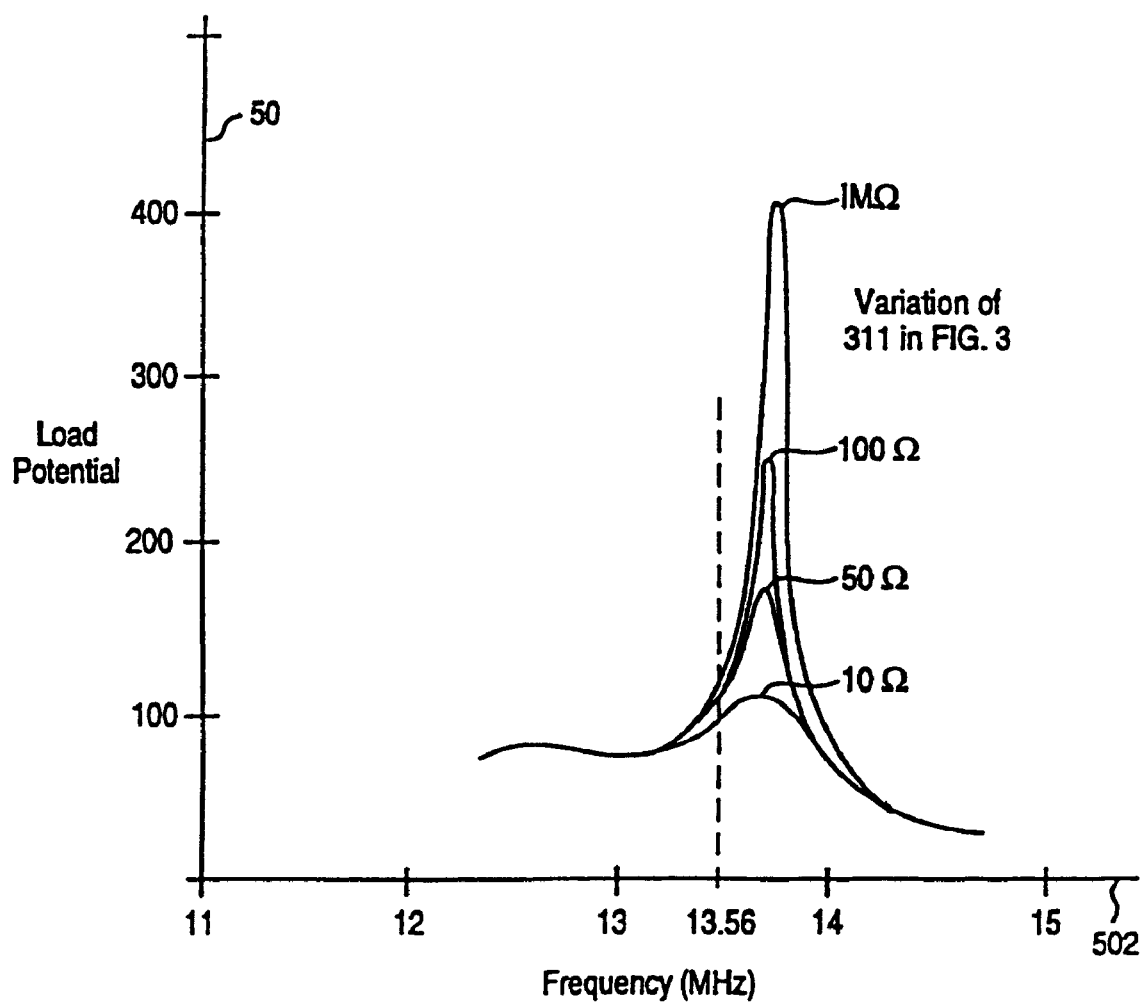
FIG. 5 graphically illustrates the simulation of varying frequency versus applied voltage to a load for various real parts of the load impedance.

FIG. 5 graphically illustrates a simulation of plasma ignition in a plasma chamber coupled to the impedance matching network 220 of FIG. 3, where the frequency of the applied voltage increases to slightly above 13.56 MHz, then returns to 13.56 MHz during the processing cycle within a period of milliseconds. The vertical axis 501 represents the applied voltage on capacitive and resistive load components 310 and 311 in FIG. 3, while the horizontal axis 502 represents the frequency of the applied voltage.

The analysis illustrates that the applied voltage peaks slightly above 13.56 MHz at levels high enough to strike the plasma, as desired. As can be seen, the frequency of the applied voltage is swept above 13.56 MHz to the voltage peak, at which point the plasma is struck before the frequency of the applied voltage automatically returns to 13.56 MHz.

This graph illustrates a series of curves for various plasma chamber impedances. The resistive load component 311 in FIG. 3 is the characteristic impedance of the plasma chamber chemistry. While it is not necessary for purposes of understanding the present invention to fully describe the various plasma chambers, in general, this method of varying the frequency of the applied voltage is valid for all plasma chambers. It should be noted that the impedance matching network 220 develops a high voltage at the beginning of the plasma processing cycle. The high voltage is needed to start ionization and, hence, plasma ignition, as the voltage peaking in FIG. 5 illustrates. The plasma processing cycle is the elapsed time that the plasma is ignited. A typical processing time is a few seconds, however, in some cases, it may be longer. As will be discussed in greater detail, the impedance matching capability of the network 220 in FIG. 3 is accomplished by changing the frequency of the applied voltage and changing, via solid state components, the capacitance of the impedance matching network 220 in response thereto.

An impedance matching network as may be embodied by the present invention provides maximum power transfer between a RF power generator and a load, e.g., a plasma chamber. The impedance matching network provides an input impedance that matches the internal impedance of the RF power generator, typically 50 ohms, while providing an impedance to the plasma chamber that matches the varying impedance of the plasma chamber.

The impedance of the plasma chamber varies according to the stage at which it is operating. For example, before plasma ignition, the impedance of a capacitive plasma chamber is as high as 10 megaohms, while after ignition the impedance drops drastically and may be as low as approximately is 2 ohms. In an inductive plasma chamber, impedance can be lower than 1 ohm before ignition and as high as 10 ohms after the ignition. (It should be noted that while a capacitive plasma chamber is used in the examples provided herein, similar principles apply for inductive chambers as well). When the plasma is not yet ignited, the plasma chamber is essentially a vacuum chamber and high voltages are required to ignite the plasma, hence, the high impedance. The circuit Q is very high at that time. The impedance may further vary during operation, depending on a number of factors, including the size of the plasma chamber, gas chemistry, and gas pressure. At some point in the process cycle, a chemical mixture of gases is pushed into the plasma chamber. The gases may be used for etching, deposition, or cleaning target material in the plasma chamber. The ionized gases inside the plasma chamber present low impedance to the impedance matching network 220 that is supplying RF power to the plasma chamber. To maximize power transfer between the generator and the plasma chamber, the impedance matching network needs to respond to impedance changes in the plasma chamber in the shortest time reasonably possible, e.g., within 100 milliseconds or less.

Figure 6:
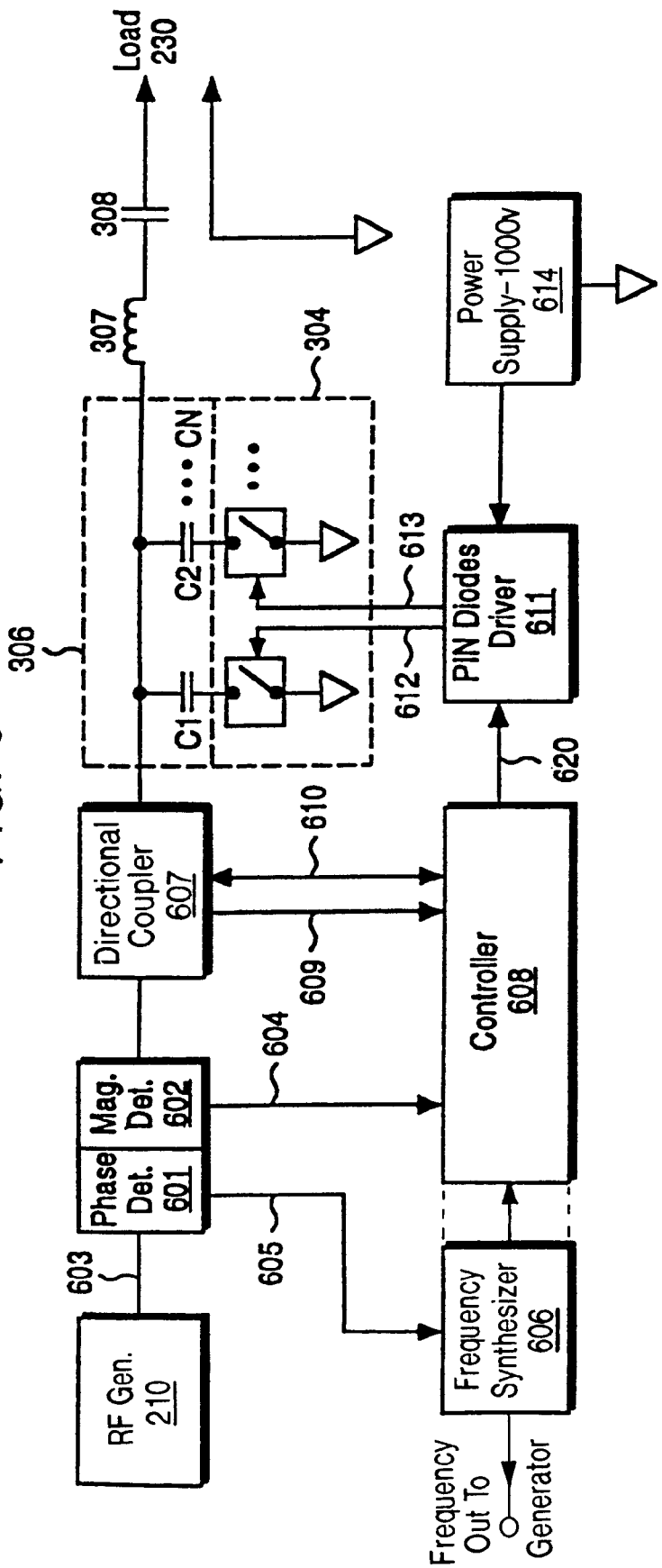
FIG. 6 illustrates an embodiment of the present invention.

The output of the impedance matching network 220 is a series resonant circuit that presents the conjugate impedance to the load for impedance matching. The present invention utilizes an L-type impedance matching network in a low pass configuration. With reference to FIG. 6, the network comprises a shunt capacitance 306 and a series inductance 307. The capacitance 306 reduces any inductive impedance in the load 230, while the inductance 307 resonates with, i.e., cancels, any capacitive reactive component present in the load. In one embodiment, the capacitance 306 (also referred to as load capacitance) is electronically variable by way of PIN diode-controlled switch circuit 304 whenever the magnitude of the input impedance deviates from the internal impedance of the power generator 210, e.g., 50 ohms. In a second embodiment, switch circuit 304 may be controlled by RF relays (not shown).

A magnitude detector 602 samples impedance on the transmission line 603 at e.g., 50 ohms, and generates a signal 604 that switches on a bank of one or more shunt capacitors comprising capacitance 306 via their respective PIN diodes, depending on the magnitude of the input impedance which varies according to the load. The polarity of the signal governs whether there is an increase or decrease in shunt capacitance 306. In either case, the inductance provided by series inductance 307 remains unchanged.

While capacitance 306 is illustrated as having two fixed shunt capacitors C1 and C2, any number of capacitors in parallel may be utilized. The greater the number of capacitors, the more accurate the adjustment possible in matching the input impedance to the load impedance. However, from a practical point of view, there is no reason to increase the number of capacitors beyond a certain number, e.g., 8 or 10, to obtain a full range of discrete values. In one embodiment of the present invention, the capacitors being switched, e.g., C1 and C2, each have a value that is one half the value of the previous capacitor. For example, if C1=400 pF, then C2=200 pF, and capacitor C(n) is one half the capacitance of capacitor C(n−1), etc.

The controller 608 contains well known devices such as a multiplier/divider chip, a comparator, an analog to digital converter, and a buffer. The controller 608 evaluates the signals thus input, compares them with a reference signal, and generates control voltages to drive a PIN diode driver circuit 611. The PIN diode driver circuit 611 enables the switching devices, i.e., PIN diodes, in switch circuit 304 via lines 612 and 613. The PIN diodes are switched on according to the signals received from the PIN diode driver circuit 611, which in turn is controlled by controller 608. If the PIN diodes receive no signal, they are biased into a cutoff state, i.e., no conduction. The combination of capacitors switched on is selected for the best impedance match between the RF generator 210 and the load 230.

Figure 7:
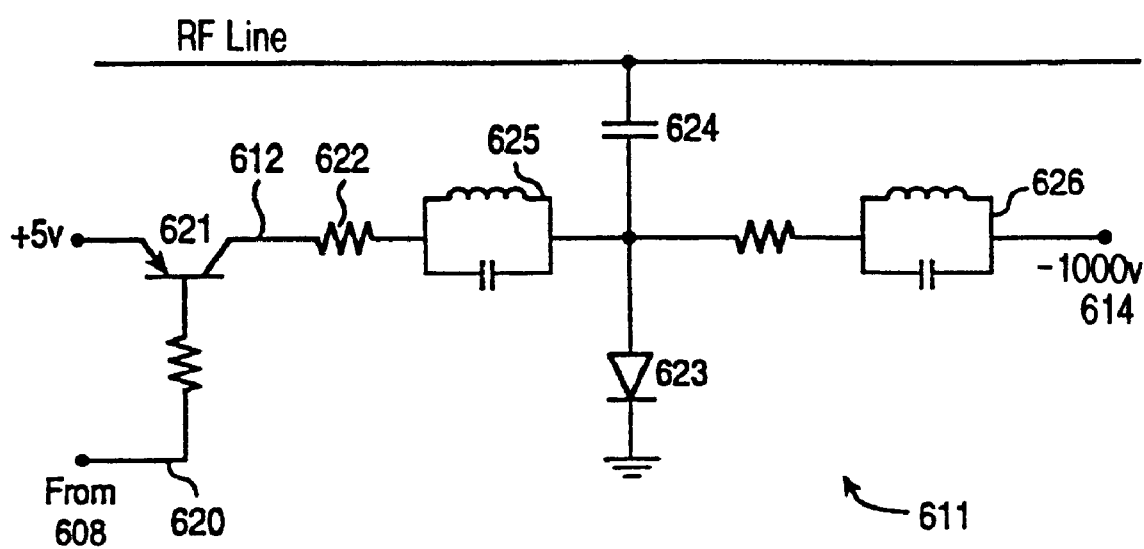
FIG. 7 is a circuit diagram of PIN diodes driver in FIG. 6.

In FIG. 7, the PIN diodes driver is illustrated, where, for example, PIN diode 623 is turned on and capacitor 624 is thus connected to ground via a low resistance PIN diode. To turn on PIN diode 623, a control line 620 driven by controller 608, transmits zero volts, or a logical zero. Hence, turning transistor 621 on and forward biasing PIN diode 623 with current (0.5 amps of direct current in one embodiment). Resistor 622 controls the DC bias current. At that high DC current in the forward direction, PIN diode 623 exhibits very low dynamic resistance (about 0.1 ohm in one embodiment), thereby shorting capacitor 624 to ground. When control line 20 is driven high, e.g., 5 volts, by controller 608, the transistor 621 is in an off state —no DC current flows in the forward direction. At the same time, negative voltages (–1000 volts in one embodiment) appear on the p–side of the PIN diode 623, forcing the PIN diode to an off state. The LC networks 625 and 626 operate as filters resonating at the RF frequency, e.g., 13.56 MHz and not allowing RF signals to reach the power supply 614.

Figure 1:
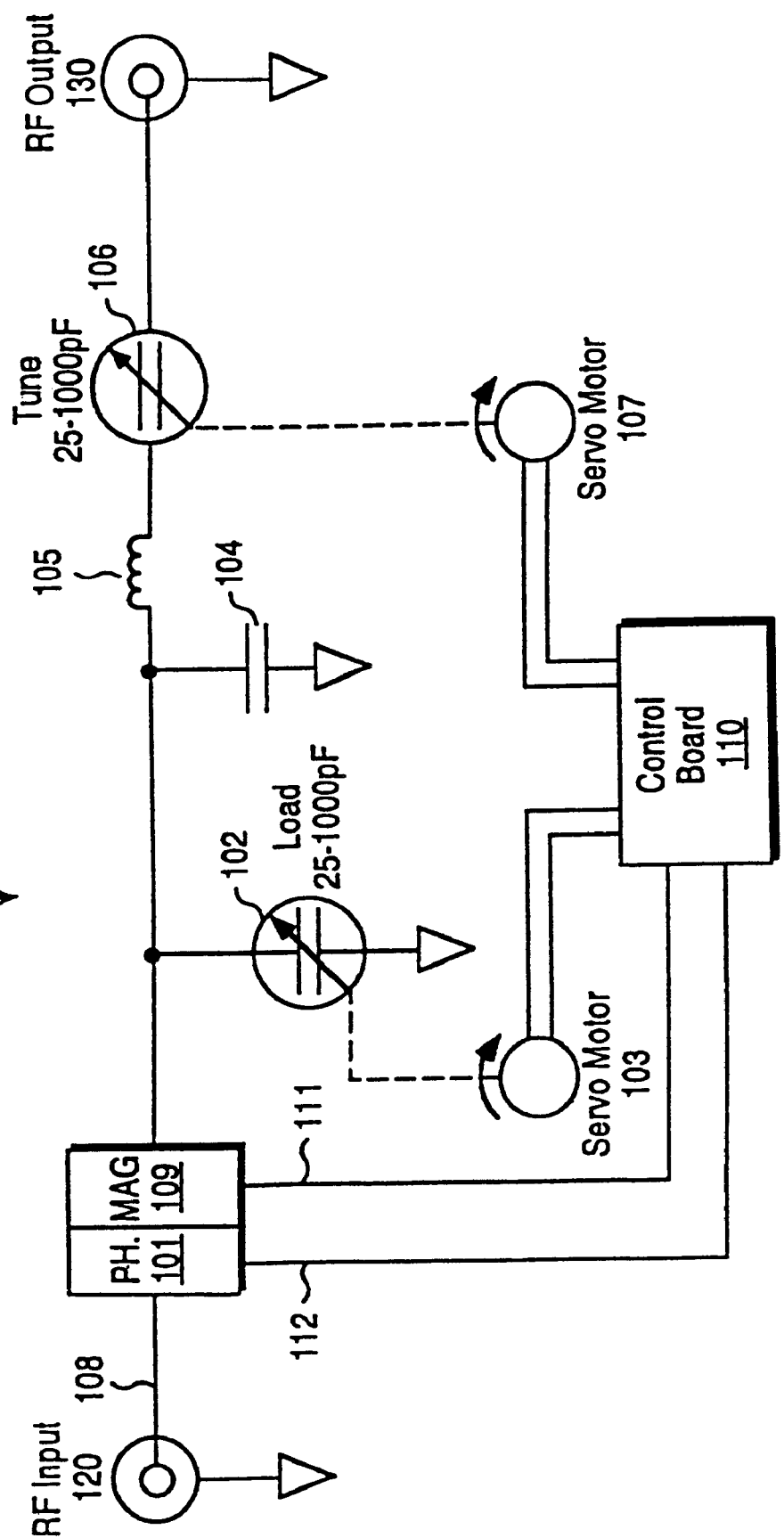
FIG. 1 illustrates an embodiment of a prior art impedance matching network as may be utilized by an RF power generator to match the impedance of the generator and an attached load.

FIG. 6 further illustrates phase detector 601. Whereas in the prior art illustrated in FIG. 1, the phase detector was used to control series capacitance, one embodiment of the present invention utilizes the phase detector only to control the frequency of the applied voltage. The phase detector 601 samples the phase of the impedance on the transmission line 603 at 50 ohms and generates a signal 605 that controls a frequency synthesizer circuit 606. To match the impedance of the load, the frequency synthesizer circuit 606 adjusts, via line 620, the frequency of the applied voltage provided by the RF generator 210 according to the phase detector signal 605. Frequency changes in the applied voltage required during normal plasma chamber operation are typically less than 1 MHz. Thus, the frequency changes of the RF power generator can be limited to a commensurate upper and lower limit. It is desirable to so limit the frequency because filters and other circuits in the impedance matching network are optimized for this particular frequency range. Moreover, it is possible to stay within the ±1 MHz limit and have a full range of acceptable impedance load variations.

As stated above, the magnitude of the input impedance of transmission line 603 varies according to the load, and thus, is continuously sampled by magnitude detector 602, which generates the signal 604 that switches on one or more of the capacitors in the bank of shunt capacitors 306 depending on the input impedance magnitude deviation from 50 ohms. The magnitude error signal (i.e., the measured difference between the magnitude of the input impedance and desired impedance of 50 ohms) is also affected by the phase error (i.e., the difference between the phase of the input impedance and desired phase of 0 degrees). In other words, the magnitude error signal is not reliable unless the phase error signal is at or near zero, i.e., the input impedance is real (non-reactive). Varying the capacitance provided by bank of capacitors 306 based solely on the change in the magnitude of the input impedance, as measured by magnitude detector 602, is not as accurate, then, as when taking the frequency phase shift, as measured by phase detector 601, into account as well.

The capacitors are switched only when the phase error is at or near zero. First, the frequency is modified based on the phase error signal from 601 until the signal is near zero. Only then the magnitude error signal from 602 is considered and the capacitors in 306 are switched based on that signal. These two steps (1) changing frequency, and 2) changing capacitors) are repeated until both phase and magnitude error signals are at or near zero.

Figure 8:
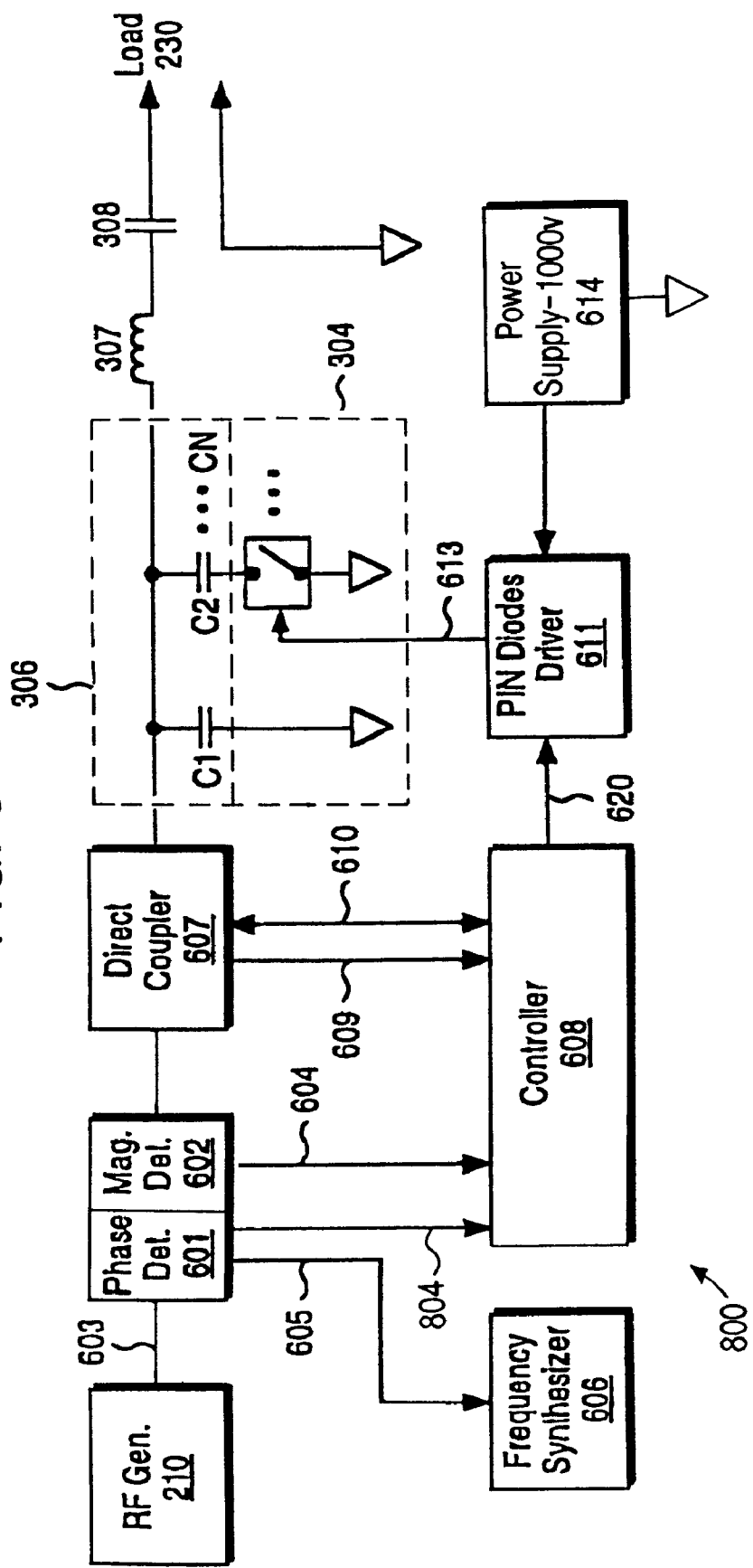
FIG. 8 is a block diagram of one embodiment of the present invention.

As seen with reference to FIG. 8, in this embodiment 800, controller 608 receives input not only from magnitude detector 602 but phase detector 601 as well, via input line 804. Phase detector 601, therefore, provides input for controlling not only the frequency of the applied voltage, but input for controlling the capacitance of impedance matching network 800.

The configuration of the capacitors is: one fixed (typically 200 pF) and three switched. The three switched capacitors are not necessarily in binary order. Also, unlike binary systems, not all combinations of these capacitors are used. If the capacitors are labeled C1 (the fixed capacitor), and C2, C3, C4 (the three switched capacitors) then only the following four combinations are allowed:

C1;

C1+C2;

C1+C2+C3;

C1+C2+C3+C4.

Thus, it is not possible to have capacitor C3 switched on if capacitor C2 is not switched on. This reduces the number of possible total capacitances (four versus eight in a binary system) but eliminates undesirable transients of a binary system.

Recall that the goal of the impedance matching network is to maintain an input impedance that is the conjugate of the internal impedance of the generator. Thus, according to one embodiment of the present invention, before switching capacitors in bank 306, controller 608 determines the absolute difference between the internal generator impedance and the input impedance, as detected by magnitude detector 602. Controller 608 sends the appropriate signals to PIN diodes driver 611 to switch certain of the capacitors in bank 306 only to decrease the present absolute difference in magnitude of internal versus input impedance.

Thus, embodiments of the invention may tune the impedance matching network based on one or more of the parameters for input impedance magnitude, input impedance phase shift, incident power, reflected power, and capacitive reactance provided by bank of capacitors 306.

There are, of course, alternatives to the described embodiment that are within the understanding of one of ordinary skill in the relevant art. The present invention, therefore, is limited by the claims presented below.

What claimed is:

1. An impedance matching network coupling a radio frequency power generator (RFPG) to a load, comprising:

a phase detector coupled to said RFPG, said phase detector to detect a phase shift in a voltage and a current provided by said RFPG;

a magnitude detector coupled to said RFPG, said magnitude detector to detect a magnitude of an impedance of said load;

a fixed capacitance in parallel to said load;

a variable capacitance in parallel to said load;

an inductance in series with said load;

a fixed capacitance in series with said load;

a switching circuit coupled to said magnitude detector to couple and decouple said variable capacitance in parallel to said load to said ground depending on said magnitude of said impedance of said load detected by said magnitude detector, further coupled to said phase detector for coupling and decoupling said variable capacitance in parallel to said load to said ground depending on the magnitude of said impedance of said load detected by said magnitude detector and the phase shift in a voltage and a current detected by said phase detector, when said phase shift in said voltage and said current is approximately zero as detected by said phase detector.

2. The impedance matching network of claim 1 wherein said variable capacitance comprises a plurality of capacitors in parallel to said load.

3. The impedance matching network of claim 2 wherein said plurality of capacitors equals 3 capacitors.

4. The impedance matching network of claim 2 wherein each one of said plurality of capacitors has a fixed value of capacitance.

5. The impedance matching network of claim 2 wherein each one of said plurality of capacitors has a fixed value of capacitance.

6. The impedance matching network of claim 5 wherein said plurality of capacitors is ordered such that each successive one of said plurality of capacitors has a value of capacitance generally one-half the value of capacitance of a previous capacitor in said ordered plurality of capacitors.

7. The apparatus of claim 5, wherein the fixed capacitance in parallel to said load comprises a capacitance C1, and wherein said plurality of capacitors comprises N capacitors $C_2, \ldots CN$ which are ordered successively, and wherein the plurality of capacitors in parallel to said load comprises a group from a set of m groups of capacitors $(C_2), (C_2, C_3), (C_2, C_3, C_4), \ldots (C_2, C_3, C_4 \ldots C_m)$, where an integer m is such that $m \leq N$, the $m^{th}$ group comprising the consecutively numbered capacitors $C_2$ through $C_m$.

8. The impedance matching network of claim 2 wherein said switching circuit is comprised of a plurality of radio frequency relays, each coupled to one of said plurality of capacitors for coupling and decoupling one of said plurality of said capacitors to ground.

9. The impedance matching network of claim 2 wherein said switching circuit is comprised of a plurality of diodes each coupled to one of said plurality of capacitors for coupling and decoupling said one of said plurality of capacitors to ground.

10. The impedance matching network of claim 9 wherein each one of said plurality of diodes has a large intrinsic region between a p-doped semiconducting region and an n-doped semiconducting region.

11. An impedance matching network coupled to a transmission line, said transmission line coupling a radio frequency power generator to a load, said impedance matching network comprising:

a phase detector coupled to said transmission line, said phase detector detecting a phase shift in a voltage and a current on said transmission line;

a frequency synthesizer circuit coupled to said phase detector, said frequency synthesizer circuit changing the frequency of said voltage depending on said phase shift in said voltage and said current on said transmission line detected by said phase detector;

a magnitude detector coupled to said transmission line, said magnitude detector detecting an impedance on said transmission line;

a plurality of capacitors coupled to said transmission line parallel to said load;

an inductance coupled to said transmission line in series with said load;

a capacitance coupled to said transmission line in series with said load, said capacitance, said plurality of capacitors, and said inductance forming an L-type impedance matching network;

a plurality of switches, each coupled to one of said plurality of capacitors, said plurality of switches coupling and decoupling said plurality of capacitors to a ground depending on said impedance of said transmission line detected by said magnitude detector and said phase shift in said voltage and said current on said transmission line detected by said phase detector; and a controller coupled to said magnitude detector, said phase detector and said plurality of switches for controlling said plurality of switches depending on said magnitude of said impedance, and said phase shift in said voltage and said current, on said transmission line, when said phase shift in said voltage and said current on said transmission line is approximately zero, as detected by said phase detector.

12. The impedance matching network of claim 11 wherein said plurality of switches comprises a plurality of diodes each coupled to one of said pluraity of capacitors for coupling and decoupling said capacitors to said ground.

13. The impedance matching network of claim 12 wherein each one of said plurality of diodes is a PIN diode.

14. The impedance matching network of claim 11 wherein said plurality of switches comprises a plurality of radio frequency relays each coupled to one of said capacitors for coupling and decoupling said one of said plurality of capacitors to said ground.

15. The impedance matching network of claim 11 further comprising a resistance coupled to said transmission line parallel to said load, said resistance maintaining said plurality of capacitors in a discharged state depending on said magnitude of said impedance of said transmission line.

* * * * *